United States Patent
Kitamura et al.

(10) Patent No.: US 8,648,464 B2
(45) Date of Patent: Feb. 11, 2014

(54) SEMICONDUCTOR DEVICE AND MANUFACTURING METHOD THEREOF

(75) Inventors: Masayuki Kitamura, Yokohama (JP);
Makoto Wada, Yokohama (JP); Yuichi Yamazaki, Inagi (JP); Masayuki Katagiri, Kawasaki (JP); Atsuko Sakata, Yokohama (JP); Akihiro Kajita, Yokohama (JP); Tadashi Sakai, Yokohama (JP); Naoshi Sakuma, Yokohama (JP); Ichiro Mizushima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 127 days.

(21) Appl. No.: 13/413,854

(22) Filed: Mar. 7, 2012

(65) Prior Publication Data

US 2012/0228614 A1 Sep. 13, 2012

(30) Foreign Application Priority Data

Mar. 10, 2011 (JP) ................................. 2011-052863

(51) Int. Cl.
*H01L 23/48* (2006.01)

(52) U.S. Cl.
USPC .... 257/750; 257/757; 257/768; 257/E23.165; 977/734

(58) Field of Classification Search
USPC ......... 257/750, 757, 761, 763, 764, 768, 769, 257/52, E23.145, E23.163, E23.165, 257/E29.004; 977/734
See application file for complete search history.

(56) References Cited

U.S. PATENT DOCUMENTS

| | | | | |
|---|---|---|---|---|
| 8,236,118 B2* | 8/2012 | Veerasamy | .................... | 156/150 |
| 8,358,008 B2* | 1/2013 | Wada et al. | .................... | 257/750 |
| 8,361,924 B2* | 1/2013 | Tanaka et al. | .................. | 502/313 |
| 8,378,335 B2* | 2/2013 | Yamazaki et al. | ............... | 257/29 |
| 8,410,608 B2* | 4/2013 | Wada et al. | .................... | 257/762 |
| 2011/0108609 A1* | 5/2011 | Woo et al. | ...................... | 228/176 |
| 2012/0080661 A1* | 4/2012 | Saito et al. | ...................... | 257/29 |

FOREIGN PATENT DOCUMENTS

| | | |
|---|---|---|
| JP | 2009-70911 | 4/2009 |
| JP | 2009-164432 | 7/2009 |

OTHER PUBLICATIONS

U.S. Appl. No. 13/768,567, filed Feb. 15, 2013, Yamazaki, et al.
U.S. Appl. No. 13/684,297, filed Nov. 23, 2012, Yamazaki, et al.

* cited by examiner

*Primary Examiner* — Tuan N. Quach
(74) *Attorney, Agent, or Firm* — Oblon, Spivak, McClelland, Maier & Neustadt, L.L.P.

(57) ABSTRACT

According to one embodiment, a semiconductor device is disclosed. The device includes a semiconductor substrate, and an interconnection above the semiconductor substrate. The interconnection includes a co-catalyst layer, a catalyst layer on the co-catalyst layer, and a graphene layer on the catalyst layer. The co-catalyst layer includes a portion contacting the catalyst layer. The portion has a face-centered cubic structure with a (111) plane oriented parallel to a surface of the semiconductor substrate. The catalyst layer has a face-centered cubic structure with a (111) plane oriented parallel to the surface of the semiconductor substrate.

4 Claims, 12 Drawing Sheets

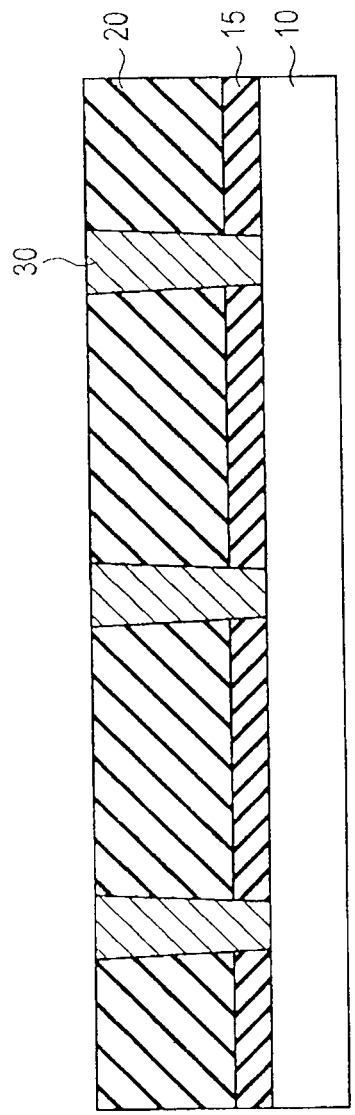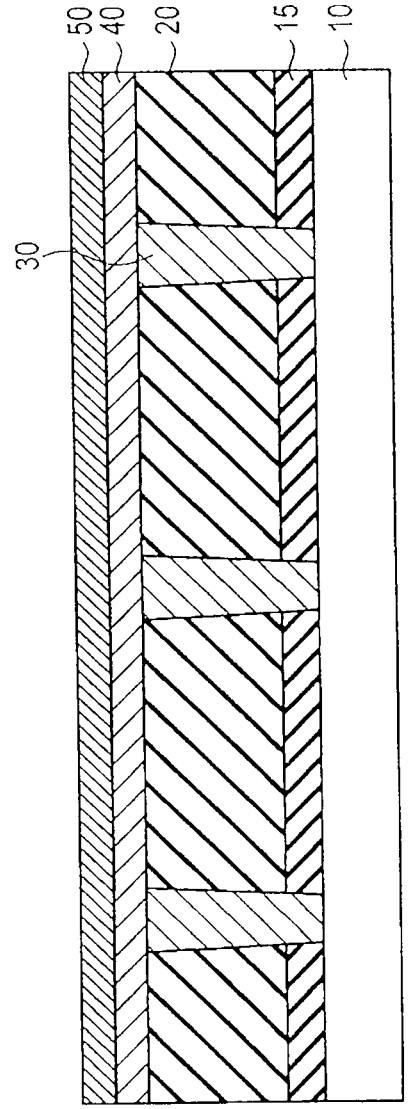
FIG. 4
FIG. 5

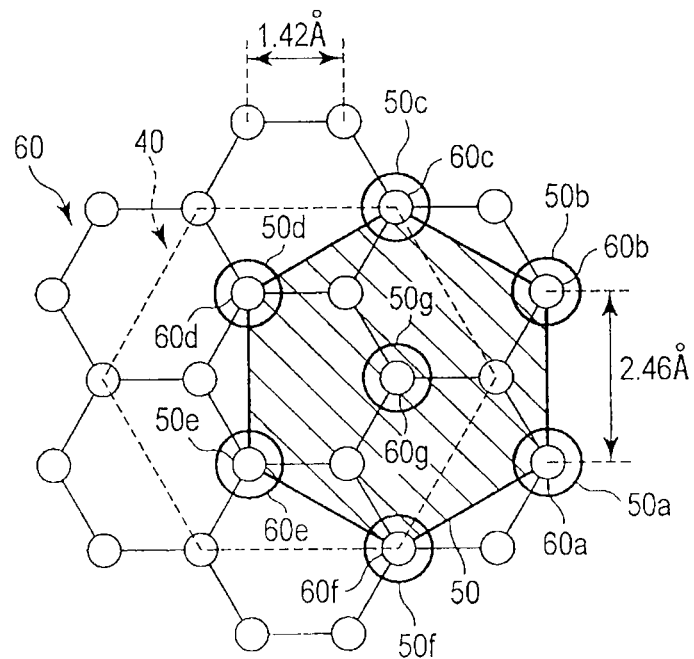
F I G. 9
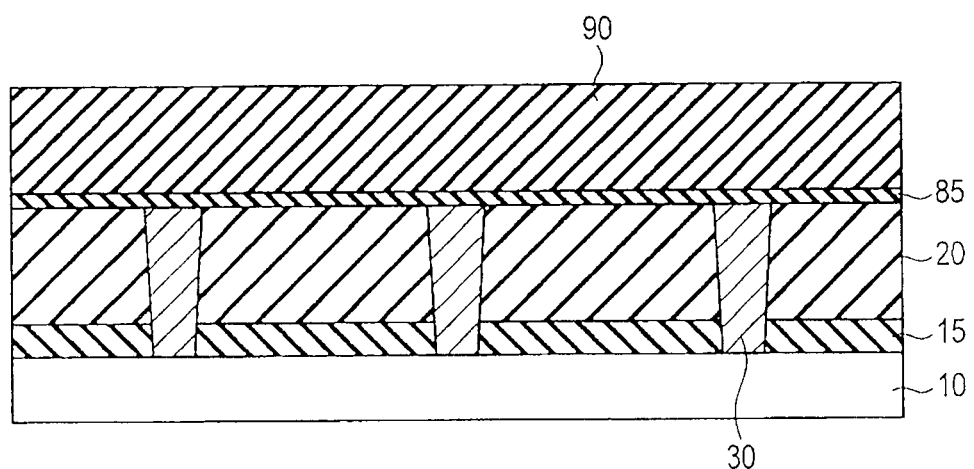
F I G. 10

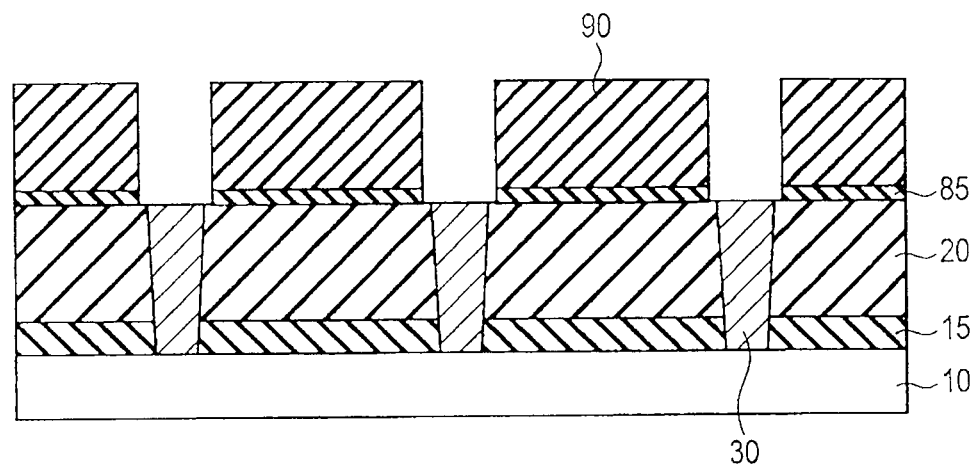
F I G. 11
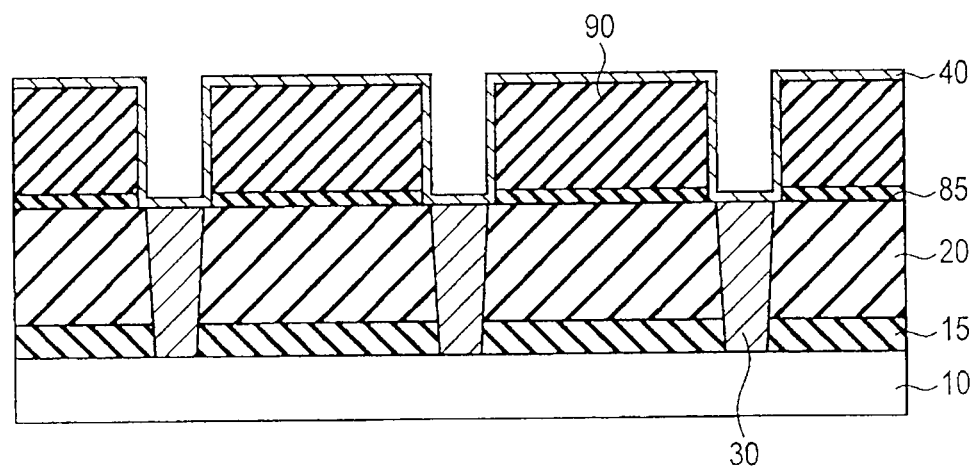
F I G. 12

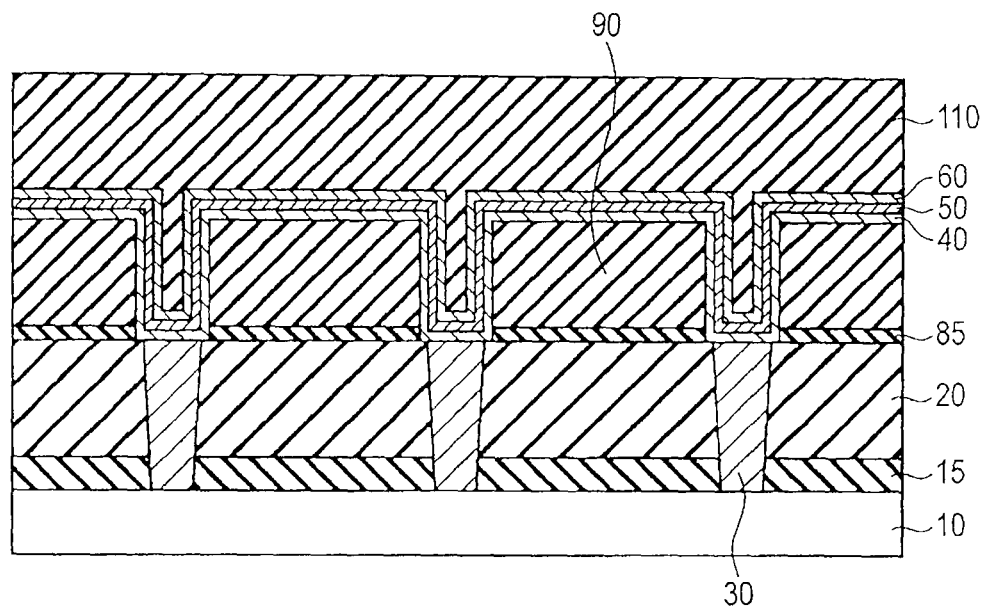
F I G. 15
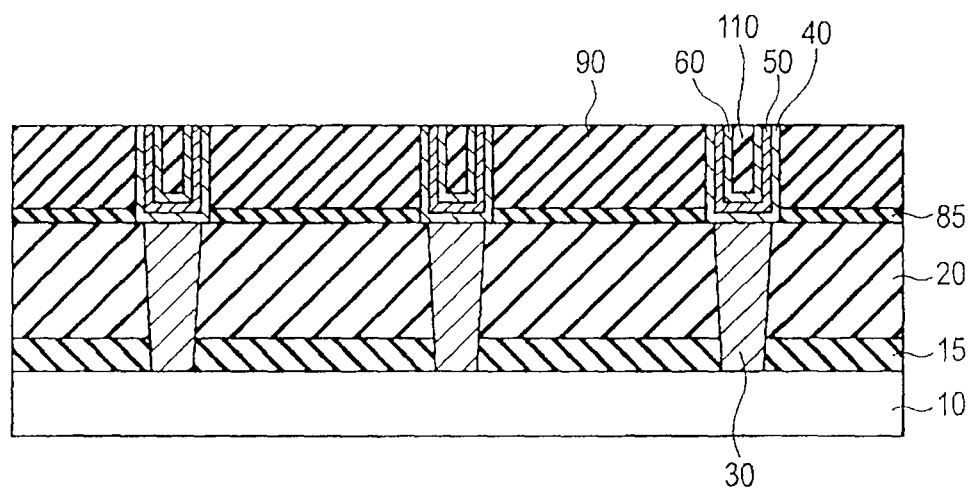
F I G. 16

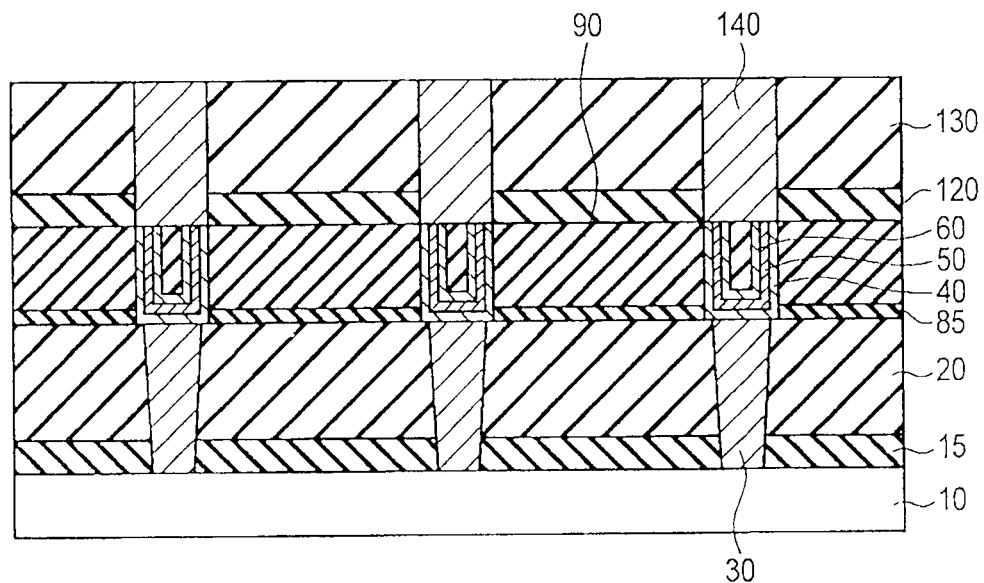
F I G. 17
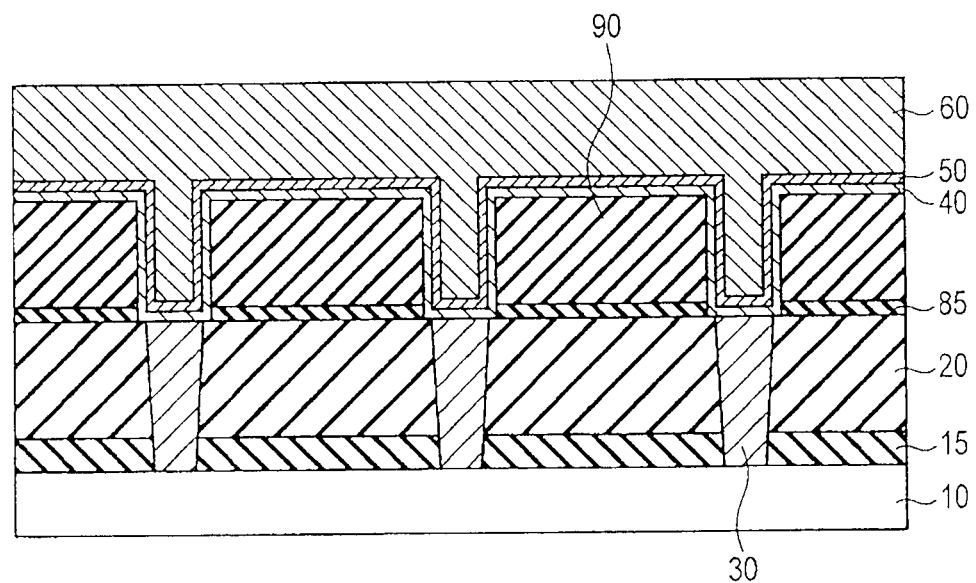
F I G. 18

SEMICONDUCTOR DEVICE AND MANUFACTURING METHOD THEREOF

CROSS-REFERENCE TO RELATED APPLICATIONS

This application is based upon and claims the benefit of priority from prior Japanese Patent Application No. 2011-052863, filed Mar. 10, 2011, the entire contents of which are incorporated herein by reference.

FIELD

Embodiments described herein relate generally to a semiconductor device and a manufacturing method thereof.

BACKGROUND

Recently, there occurs a problem of degradation in the reliability due to stress migration or electro migration, an increase in the current density, a rise in the electrical resistivity due to interface inelastic scattering of electrons and the like as interconnections are further miniaturized in an LSI interconnection structure. As an interconnection material of LSI, copper that is low-resistance metal is mainly used, but if the interconnection structure is further miniaturized, the above problem still occurs.

Therefore, use of graphene as an interconnection material of LSI is studied. It is known that graphene performs quantization conduction (so-called Ballistic conduction) and is expected as an extremely low resistance material instead of an existing metal material. Since electrons are not substantially subject to interface scattering in quantization conduction, the resistance does not substantially increase even if the interconnection structure is miniaturized.

However, in the case of polycrystalline graphene with a small grain size, a large number of crystal defects such as grain boundaries are present in the graphene.

BRIEF DESCRIPTION OF THE DRAWINGS

FIG. 4 is a cross-sectional view showing the manufacturing method of the semiconductor device according to the first embodiment;

FIG. 5 is a cross-sectional view showing the manufacturing method of the semiconductor device following FIG. 4;

FIG. 9 is a conceptual diagram showing a six-membered ring of a co-catalyst, a six-membered ring of a catalyst layer provided on the co-catalyst and a six-membered ring of a graphene layer provided on the catalyst layer as viewed from above the surface of the semiconductor substrate;

FIG. 10 is a view showing a manufacturing method of a semiconductor device of a third embodiment;

FIG. 11 is a cross-sectional view showing the manufacturing method of the semiconductor device following FIG. 10;

FIG. 12 is a cross-sectional view showing the manufacturing method of the semiconductor device following FIG. 11;

FIG. 15 is a cross-sectional view showing the manufacturing method of the semiconductor device following FIG. 11;

FIG. 16 is a cross-sectional view showing the manufacturing method of the semiconductor device following FIG. 15;

FIG. 17 is a cross-sectional view showing the manufacturing method of the semiconductor device following FIG. 16;

FIG. 18 is a cross-sectional view showing the damascene interconnection forming method using a co-catalyst layer, catalyst layer and protection film of the embodiment;

DETAILED DESCRIPTION

Embodiments are explained below with reference to the drawings.

In general, according to one embodiment, a semiconductor device is disclosed. The semiconductor device includes a semiconductor substrate; and an interconnection provided above the semiconductor substrate, the interconnection including a co-catalyst layer, a catalyst layer provided on the co-catalyst layer, and a graphene layer provided on the catalyst layer. The semiconductor device further includes the co-catalyst layer including a portion contacting the catalyst layer, the portion having a face-centered cubic structure with a (111) plane oriented parallel to a surface of the semiconductor substrate, or having a hexagonal close-packed structure with a (002) plane oriented parallel to the surface of the semiconductor substrate, or the co-catalyst layer including a portion contacting the catalyst layer, the portion having an amorphous structure or a microcrystalline structure. The semiconductor device further includes the catalyst layer having a face-centered cubic structure with a (111) plane oriented parallel to the surface of the semiconductor substrate, or having a hexagonal close-packed structure with a (002) plane oriented parallel to the surface of the semiconductor substrate.

First Embodiment

Figure 1:
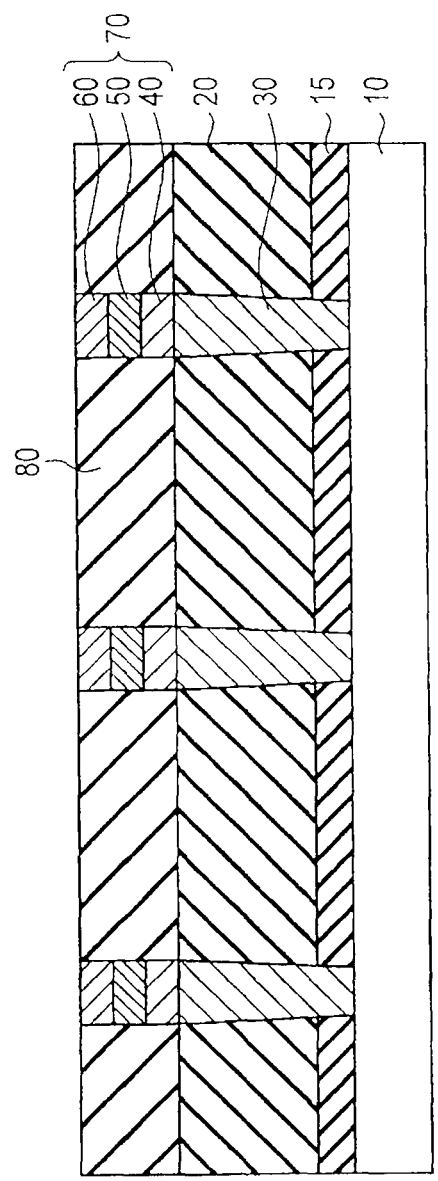
FIG. 1 is a cross-sectional view showing the structure of a semiconductor device according to a first embodiment.

FIG. 1 is a cross-sectional view showing the structure of a semiconductor device according to a first embodiment. In the following drawings, the same symbols are attached to portions corresponding to those of the former drawings and the detailed explanation thereof is omitted.

The semiconductor device of the present embodiment comprises a semiconductor substrate 10, interlayer insulating films 15, 20, 80, contact plugs 30 and interconnections 70. For example, the semiconductor substrate 10 is, a silicon substrate.

For example, the interlayer insulating films 15, 20, 80 are each formed of an insulating film such as a silicon oxide film or silicon nitride film. For example, the contact plug 30 is formed of a conductive material such as copper, tungsten or aluminum and contacts the semiconductor substrate 10 through the interlayer insulating films 15, 20.

The interconnection 70 is a laminated film of a co-catalyst layer 40, catalyst layer 50 and graphene layer 60. The co-catalyst layer 40 is provided on the interlayer insulating film 20 and contact plug 30 which are provided on the semiconductor substrate 10. The co-catalyst layer 40 is formed of a material having a face-centered cubic structure or a hexagonal close-packed structure.

For example, the co-catalyst layer 40 is a single-layered film formed of one or more materials selected from a first group consisting of Ti, Cu, Zn, Zr, Ru, Rh, Pd, Ag, Hf, Re, Ir, Pt and Au, a single-layered film formed of nitride of one or more materials selected from the first group, a single-layered film formed of alloy comprising at least two materials selected from the first group, or a laminated film including at least two material selected from a second group consist of Ti, Cu, Zn, Zr, Ru, Rh, Pd, Ag, Hf, Re, Ir, Pt, Au, every nitride comprising one or more materials selected from the first group, and every alloy comprising at least two of the materials selected from the first group.

For example, TiN, Cu, Pt have a face-centered cubic structure and Ti, Zn, Ru have a hexagonal close-packed structure. A TaN film is also used as the co-catalyst layer 40. In addition, as the co-catalyst layer 40, a film including the following metal material may be used.

For example, the co-catalyst layer 40 is a laminated film of a TiN film (upper layer) and TaN film (lower layer), a laminated film of a TiN film (upper layer) and Ti film (lower layer), a laminated film including an Ir layer in the uppermost layer, a single-layered film of Ti, a single-layered film of TiN, or a single-layered film of TaN. Those films are formed by use of PVD (Physical Vapor Deposition) method or CVD (Chemical Vapor Deposition) method. The upper layer is a layer close to the catalyst layer 50 and graphene layer 60 and the lower layer is a layer close to the semiconductor substrate 10.

If the co-catalyst layer 40 has a face-centered cubic structure and the (111) plane is oriented parallel to the surface of the semiconductor substrate 10 or if the co-catalyst layer 40 has a hexagonal close-packed structure and the (002) plane is oriented parallel to the surface of the semiconductor substrate 10, the catalyst layer 50 is oriented such that the (111) plane of the face-centered cubic structure or the (002) plane of the hexagonal close-packed structure is parallel to the surface of the semiconductor substrate 10.

The catalyst layer 50 is provided on the co-catalyst layer 40 and is formed of a material having a face-centered cubic structure or a hexagonal close-packed structure. For example, the catalyst layer 50 is a single-layered film formed of material selected from a first group consisting of Ni, Co and Fe, a single-layered film formed of nitride comprising one or more materials selected from the first group, a single-layered film formed of alloy comprising at least two materials selected from the first group or a laminated film including at least two material selected from a second group consist of Ni, Co and Fe, every nitride comprising one or more materials selected from the first group, and every alloy at least two of the materials selected from the first group.

If the co-catalyst layer 40 has a face-centered cubic structure and the (111) plane is oriented parallel to the surface of the semiconductor substrate 10 or if the co-catalyst layer 40 has a hexagonal close-packed structure and the (002) plane is oriented parallel to the surface of the semiconductor substrate 10, the catalyst layer 50 is oriented such that the (111) plane of the face-centered cubic structure or the (002) plane of the hexagonal close-packed structure is parallel to the surface of the semiconductor substrate 10. Thereby, a graphene layer having less crystal defects and having large crystal grain size can be formed on the catalyst layer 50.

It is not necessary for the entire portion of the co-catalyst layer 40 to have the face-centered cubic structure or the hexagonal close-packed structure. It is sufficient if at least a portion of the co-catalyst layer 40 that contacts the catalyst layer 50 has the face-centered cubic structure or the hexagonal close-packed structure. For example, a laminated film of TaN film (upper layer) and Ta film (lower layer) may be used as the co-catalyst layer 40.

The interconnection 70 extends in a plane parallel to the surface of the semiconductor substrate 10. The contact plug 30 penetrates the interlayer insulating films 15, 20 to electrically connect the semiconductor substrate 10 and the interconnection 70. The interlayer insulating films 15, 20 are formed to fill a space between adjacent two of a plurality of contact plugs 30. The interlayer insulating films 80 is formed to fill a space between adjacent two of a plurality of interconnections 70.

Since graphene is nearly unaffected to the interface scattering owing to the quantization conduction, the resistance rise caused by the interface scattering effect does not occur. Further, graphene is excellent in heat resistance and can be applied to a high-temperature semiconductor manufacturing process that another metal material cannot withstand.

Thus, graphene excellent in low resistance and heat resistance is considered to be suitable for interconnections of an LSI device. For example, after the surface portion of a lower-layer interconnection is planarized, a co-catalyst layer and catalyst layer required for growing graphene are formed. Then, it is considered to grow a graphene layer on the catalyst layer.

However, it is known that the crystallinity of the graphene layer greatly varies depending on a catalyst layer used as an underlying layer. As described above, in polycrystalline graphene whose grain size is small, electrons are scattered in a grain boundary or the like and the resistance thereof rises.

In the present embodiment, the surface of the catalyst layer 50 (the surface parallel to the surface of the semiconductor substrate 10) is set to the (111) plane of the face-centered cubic structure or the (002) plane of the hexagonal close-packed structure. That is, the surface on which the graphene is to be deposited is set to the (111) plane of the face-centered cubic structure or the (002) plane of the hexagonal close-packed structure.

Figure 2:
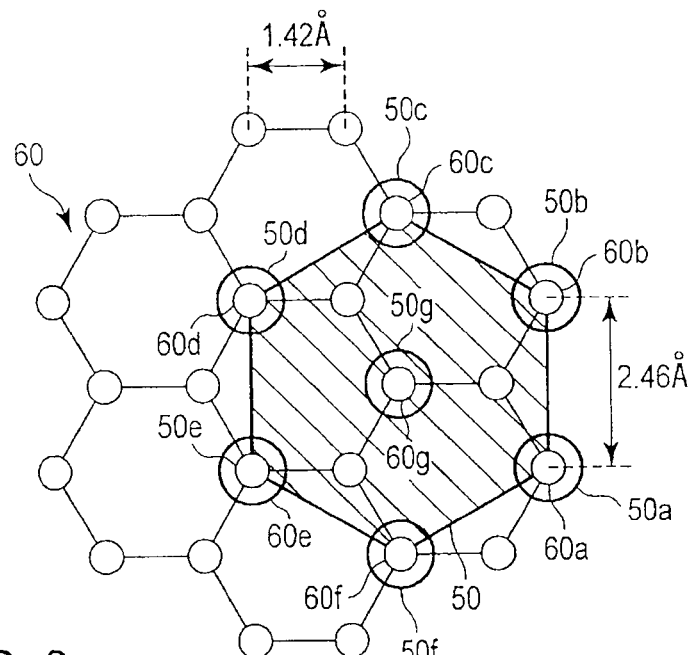
FIG. 2 is a conceptual diagram showing a six-membered ring of a catalyst layer and a six-membered ring of a graphene layer formed thereon as viewed from above the surface of a semiconductor substrate.

As shown in FIG. 2, the (111) plane of the face-centered cubic structure or the (002) plane of the hexagonal close-packed structure has a structure similar to the crystal structure of graphene.

FIG. 2 is a conceptual diagram showing a six-membered ring of the catalyst layer 50 and a six-membered ring of the graphene layer 60 formed thereon as viewed from above the surface of the semiconductor substrate 10. As shown in FIG. 2, atoms 50a to 50q configuring the six-membered ring of the catalyst layer 50 overlap in position with atoms 60a to 60g among the atoms configuring three six-membered rings of the graphene layer 60. Therefore, it is understood that the graphene layer 60 having less crystal defects can easily be formed on the catalyst layer 50.

In Table 1, a degree of lattice mismatching between the catalyst layer 50 and the graphene layer 60 is shown for various materials of the catalyst layer 50. In Table 1, composition ratios of the materials are not specified. That is, material such as CuSi means $Cu_xSi_y$, where x and y are suffixes for composition ratio, both of x and y does not have to be 1, and x and y may differ each other. The lattice mismatch degree is defined as follows.

If the distance (approximately 0.246 µm) between second neighboring atoms of the six-membered ring of the graphene layer 60 is A (reference) and the distance between neighboring atoms of the (111) plane of the face-centered cubic structure or the (002) plane of the hexagonal close-packed structure of the catalyst layer 50 is B, the lattice mismatch degree is defined as 100 (B−A)/A [%].

TABLE 1

| | Crystal structure measurement | Direction | Distance between neighboring atoms B | Lattice mismatch degree |
|---|---|---|---|---|
| Ni | fcc | (111) | 0.2491 | 1.10% |
| $CoNi_3$ | fcc | (111) | 0.2495 | 1.26% |
| Co | hcp | (002) | 0.2497 | 1.34% |
| $Cu_{0.87}Si_{0.13}$ | hcp | (002) | 0.2507 | 1.75% |
| $Mn_{0.3}Fe_{0.7}$ | hcp | (002) | 0.252 | 2.27% |
| Co | fcc | (111) | 0.2521 | 2.31% |
| Cu | fcc | (111) | 0.2556 | 3.73% |
| Fe | fcc | (111) | 0.2577 | 4.59% |
| $TaNi_3$ | hcp | (002) | 0.2585 | 4.91% |
| RuCo | hcp | (002) | 0.261 | 5.93% |
| $Al_{0.3}Ge_{0.7}$ | hcp | (002) | 0.2617 | 6.21% |
| Zn | hcp | (002) | 0.2665 | 8.16% |
| Ru | hcp | (002) | 0.2704 | 9.74% |

In the case of FIG. 2, for example, if Ni is used as the material of the catalyst layer, a difference between the distance (0.249 nm) between neighboring atoms of the (111) plane of the face-centered cubic structure and the distance (0.246 nm) between second neighboring atoms of the six-membered ring of the graphene layer 60 is as small as approximately 1.1%, and therefore, the graphene layer 60 having less crystal defects can easily be formed on the catalyst layer 50.

Further detailed study is made and, for example, when a difference in length between the distance between the neighboring atoms of the catalyst layer 50 and the distance between the second neighboring atoms of the six-membered ring of the graphene layer 60 is within 9%, preferably, within 5%, it is confirmed that the graphene layer 60 having less crystal defects can easily be formed on the catalyst layer 50 based on the G/D ratio measurement of Raman spectroscopic analysis. Further, it cannot be confirmed based on the G/D ratio measurement of Raman spectroscopic analysis that graphene having sufficient domains is formed on Ru with the difference exceeding 9%.

For example, the catalyst layer 50 is a single-film formed of a material selected from a group consisting of Ni, Co and Fe, a single-layered film formed of the nitride of the material selected from the group, a single-layered film formed of alloy comprising at least two materials selected from the group or a laminated film of two or more films including different materials selected from a group consisting of Ni and the nitride thereof, Co and the nitride thereof, and Fe and the nitride thereof.

Ni, Co and Fe that are catalyst materials are elements that can basically be mutually and entirely solid-solved. Therefore, in the alloy comprising two or more types of catalyst elements, the distance between atoms of the entire portion can be adjusted. Thus, preferable graphene growth can be attained by use of a catalyst layer including two or more kinds of catalyst elements.

Figure 3A:
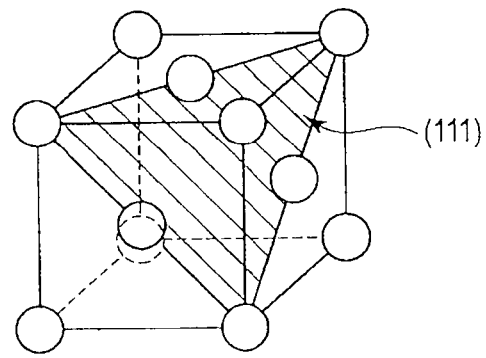
FIG. 3A and FIG. 3B are, respectively, explanatory views showing a (111) plane of a face-centered cubic structure and a (002) plane of a hexagonal close-packed structure.
Figure 3B:
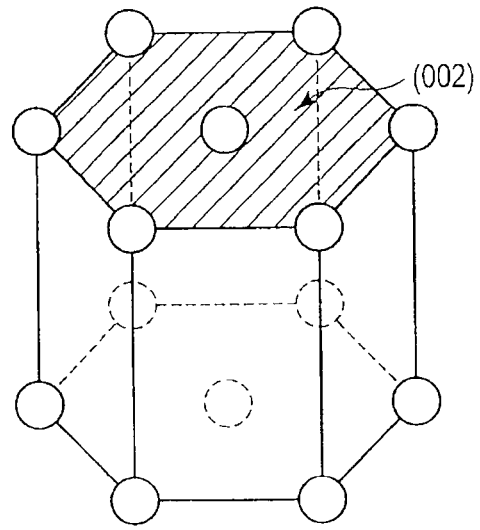

FIG. 3A and FIG. 3B are explanatory views showing the (111) plane of the face-centered cubic structure and the (002) plane of the hexagonal close-packed structure. The atomic arrangement of the (111) plane of the face-centered cubic structure is the same as that of the (002) plane of the hexagonal close-packed structure. This can be understood by extending the (002) plane shown in the drawing and considering the lattice arrangement in a long period.

According to the present embodiment, the co-catalyst layer 40 has the (111) plane of the face-centered cubic structure or the (002) plane of the hexagonal close-packed structure and the (111) plane or (002) plane set parallel to the surface of the semiconductor substrate 10. Thereby, the upper surface of the co-catalyst layer 40 on which the catalyst layer 50 is deposited becomes the (111) plane of the face-centered cubic structure or the (002) plane of the hexagonal close-packed structure. Therefore, if the catalyst layer 50 has a face-centered cubic structure, the (111) plane thereof is oriented parallel to the surface of the semiconductor substrate 10 and if it has a hexagonal close-packed structure, the (002) plane thereof is oriented parallel to the surface of the semiconductor substrate 10.

Further, the upper surface of the catalyst layer 50 on which the graphene layer 60 is deposited becomes the (111) plane of the face-centered cubic structure or the (002) plane of the hexagonal close-packed structure. As a result, the upper surface of the catalyst layer 50 on which the graphene layer 60 is deposited becomes the (111) plane of the face-centered cubic structure or the (002) plane of the hexagonal close-packed structure. Therefore, the graphene layer 60 having less crystal defects can easily be grown on the catalyst layer 50.

Like the conceptual diagram of FIG. 2, a diagram showing the laminated structure of the co-catalyst layer and the like is shown in FIG. 9. Since the lattice matching degree of the co-catalyst layer, catalyst layer and graphene layer is preferable, it is understood that the planes can be oriented with higher precision.

Table 2 shows a degree of lattice mismatching between the co-catalyst layer 40 and the graphene layer 60 for various materials of the co-catalyst layer 40. In Table 2, composition ratios of the materials are not specified in the same way as Table 1. The lattice mismatch degree is defined as follows.

If the distance (approximately 0.285 µm) between third neighboring atoms of the six-membered ring of the graphene layer 60 is A' (reference) and the distance between neighboring atoms of the (111) plane of the face-centered cubic structure or the (002) plane of the hexagonal close-packed structure of the co-catalyst layer 40 is B', the lattice mismatch degree is defined as 100 (B'−A')/A' [%].

TABLE 2

| | Crystal structure measurement | Direction | Distance between neighboring atoms B' | Lattice mismatch degree |
|---|---|---|---|---|
| WN | hcp | (002) | 0.2893 | 1.51% |
| Ti | hcp | (002) | 0.295 | 3.51% |
| $TiO_{0.2}$ | hcp | (002) | 0.2952 | 3.58% |
| TiN | fcc | (111) | 0.2998 | 5.19% |
| TaN | fcc | (111) | 0.3064 | 7.51% |
| TaO | fcc | (111) | 0.3127 | 9.72% |

The lattice mismatch degree between the graphin layer and the co-catalyst layer formed of the materials shown in Table 2 is 10% or less and the lattice mismatch degree becomes 4% or less depending on the material. A graphene layer with higher quality (having less defects) can be obtained by making small not only the lattice mismatch degree between the co-catalyst layer and the graphin layer but also the lattice mismatch degree between the co-catalyst layer and the graphin layer. Thereby, an interconnection (graphin interconnection) including a graphene layer of lower resistance can be formed.

Figure 6:
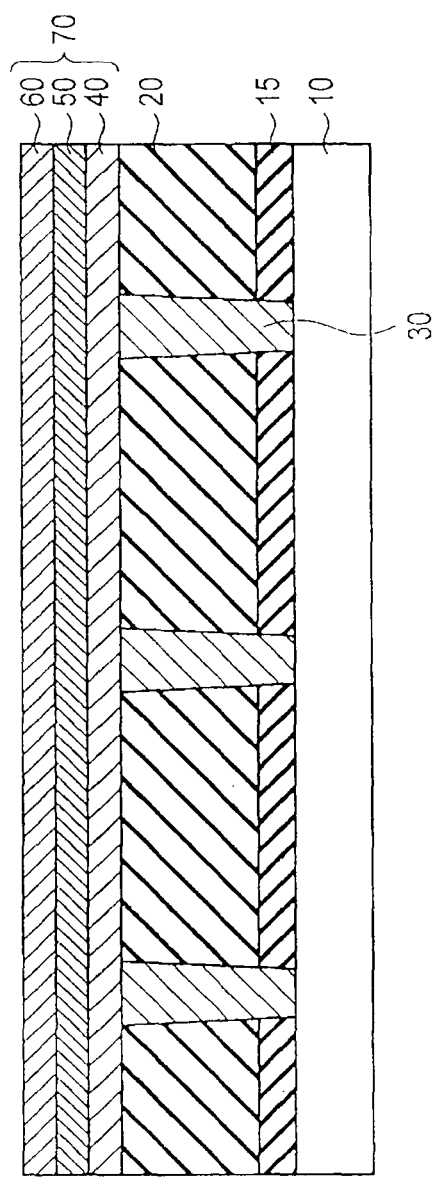
FIG. 6 is a cross-sectional view showing the manufacturing method of the semiconductor device following FIG. 5.

FIG. 4 to FIG. 6 are cross-sectional views showing the manufacturing method of the semiconductor device according to the first embodiment.

First, semiconductor elements (not shown) such as transistors or capacitors are formed on a semiconductor substrate 10. Next, interlayer insulating films 15, 20 are deposited on the semiconductor substrate 10. For example, the interlayer insulating films 15, 20 are TEOS (Tetra Ethyl Ortho Silicate) films. Next, contact plugs 30 that penetrate the interlayer insulating films 15, 20 and contact the semiconductor substrate 10 are formed.

The material of the contact plug 30 is copper, tungsten, aluminum or the like, for example. The contact plug 30 is polished by use of a CMP (Chemical Mechanical Polishing) method until the upper surface of the interlayer insulating film 20 is exposed. Thus, the structure shown in FIG. 4 is obtained.

In order to prevent metal used for the contact plug 30 from being diffused into the semiconductor substrate 10, co-catalyst layers (not shown) may be formed between the contact plugs 30 and the semiconductor substrate 10. For example, the material of the co-catalyst layer may be Ta, Ti, Ru, Mn, Co or the nitride of any of the above materials.

Next, an interconnection including a graphene layer 60 is formed on the contact plugs 30 and interlayer insulating film 20.

First, a TaN film with a thickness of, for example, approximately 1 nm to 20 nm is deposited as a co-catalyst layer 40 on the interlayer insulating film 20 and contact plugs 30 by use of the PVD method or CVD method.

As described before, the co-catalyst layer 40 may be a single-layered film formed of one or more materials selected from a group consisting of Ti, Cu, Zn, Zr, Ru, Rh, Pd, Ag, Hf, Re, Ir, Pt and Au, a single-layered film formed of nitride of one or more materials selected from the group, a single-layered film formed of alloy comprising at least two materials selected from the group, or a laminated film including at least two material selected from a group consist of Ti, Cu, Zn, Zr, Ru, Rh, Pd, Ag, Hf, Re, Ir, Pt, Au, nitride of each of the metals, and each alloy relating to the metals in which the alloy is formed of at least two of the metals.

Further, a film including the following metal material may be used as the co-catalyst layer 40. For example, the co-catalyst layer 40 is a laminated film of a TaN film (upper layer) and Ta film (lower layer), a laminated film of a TiN film (upper layer) and TaN film (lower layer), a laminated film of a TiN film (upper layer) and Ti film (lower layer), a laminated film including an Ir film in the uppermost layer (for example, a laminated film including a Ta film, Ru film and Ir film sequentially formed from the lower layer), a laminated film of a Ta film and Ru film, a single-layered film of Ti, a single-layered film of TiN or a single-layered film of TaN. The above films are formed by use of the PVD method or CVD method.

The above materials have a face-centered cubic structure or hexagonal close-packed structure. Therefore, when the co-catalyst layer 40 is deposited on the interlayer insulating film 20 and contact plugs 30, the (111) plane of the face-centered cubic structure or the (002) plane of the hexagonal close-packed structure, which is the close-packed surface from the viewpoint of surface energy, is deposited to orient parallel to the surface of the semiconductor substrate 10.

Next, Co is deposited to a thickness of, for example, approximately 1 nm to 50 nm as a material of the catalyst layer 50 on the co-catalyst layer 40 by use of the PVD method. As described before, the catalyst layer 50 may be a single-layered film formed of material of any one of Ni, Co and Fe, a single-layered film formed of nitride of any one of the materials, a single-layered film formed of alloy comprising at least two of the materials, or a laminated film of two or more films of the materials and the nitrides of the materials.

The above materials have a face-centered cubic structure or hexagonal close-packed structure. Therefore, the catalyst layer 50 is also deposited such that the (111) plane of the face-centered cubic structure or the (002) plane of the hexagonal close-packed structure is oriented parallel to the surface of the semiconductor substrate 10. At this time, the co-catalyst layer 40 is deposited such that the (111) plane of the face-centered cubic structure or the (002) plane of the hexagonal close-packed structure parallel is oriented parallel to the surface of the semiconductor substrate 10. Therefore, the catalyst layer 50 in which the (111) plane of the face-centered cubic structure or the (002) plane of the hexagonal close-packed structure is more faithfully oriented parallel to the surface of the semiconductor substrate 10 in comparison with the conventional case can be obtained. Thereby, the structure shown in FIG. 5 is obtained.

In this manner, the present embodiment uses the co-catalyst layer 40 in which the (111) plane of the face-centered cubic structure or the (002) plane of the hexagonal close-packed structure is oriented parallel to the surface of the semiconductor substrate 10, thereby, the catalyst layer 50 can be intentionally oriented such that the (111) plane of the face-centered cubic structure or the (002) plane of the hexagonal close-packed structure of the catalyst layer 50 is oriented parallel to the surface of the semiconductor substrate 10.

Then, as shown in FIG. 6, a graphene layer 60 is grown on the catalyst layer 50. For film formation of the graphene layer 60, for example, a CVD method is used. Hydrocarbon-series gas such as methane or acetylene or mixed gas thereof is used as a carbon source in the CVD method and a rare gas or hydrogen is used as carrier gas. The upper limit of formation temperatures of the graphene layer 60 is approximately 1000° C. and the lower limit thereof is approximately 200° C., the formation temperature is approximately 600° C., for example. In order to eliminate ions and electrons by use of remote plasma, an electrode may be placed on the upper portion of the semiconductor substrate 10 and a voltage may be applied thereto. The application voltage for formation of the graphene layer 60 is 0 to ±100 V, for example.

A metal film or insulating film as a protection film may be formed on the graphene layer 60. The metal film is formed by sputtering method, for example. The insulating film is formed by CVD method or coating method, for example.

Thereafter, the interconnection 70 shown in FIG. 1 is formed by processing the graphene layer 60, catalyst layer 50 and co-catalyst layer 40 by use of lithography technique and RIE (Reactive Ion Etching) method. Further, the structure shown in FIG. 1 can be obtained by depositing a material of an interlayer insulating film 80 by use of CVD method and then planarizing the material of the interlayer insulating film 80 by use of CMP method. Additionally, a multi-layered interconnection structure using graphene layers may be formed. Alternatively, a conventional interconnection using W, Cu, Al may be formed on the interconnection 70.

In this manner, the semiconductor device according to the present embodiment is completed.

Figures 7A, 7B:
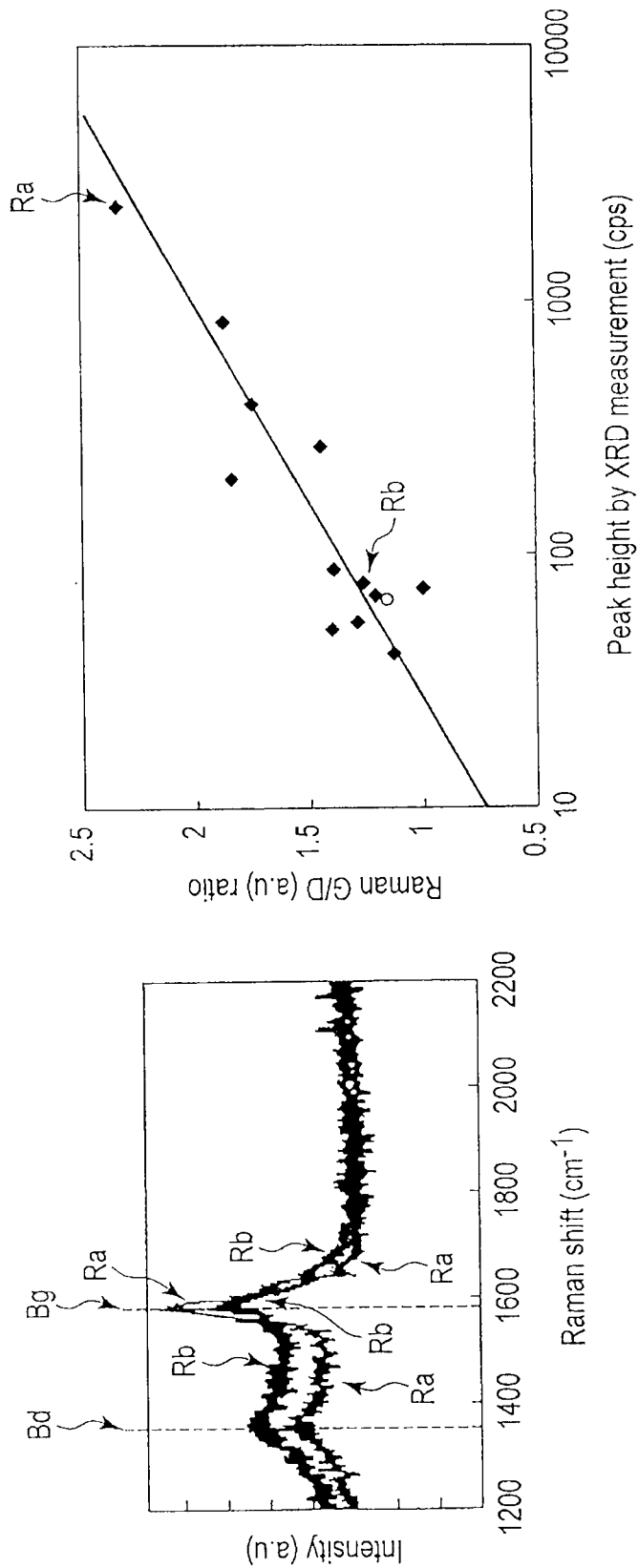
FIG. 7A and FIG. 7B are, respectively, a graph showing the result of Raman spectroscopy of a graphene layer, and a graph showing the G/D ratio with respect to the peak height of a (111) plane of a face-centered cubic structure or a (002) plane of a hexagonal close-packed structure of a catalyst layer by XRD (X-ray diffraction) method.

FIG. 7A is a graph showing the result of Raman spectroscopy of the graphene layer 60. FIG. 7B is a graph showing the G/D ratio with respect to the peak height of the (111) plane of the face-centered cubic structure or the (002) plane of the hexagonal close-packed structure of the catalyst layer 50 by XRD (X-ray diffraction) method.

In the graph of FIG. 7A, the peak positions of D band Bd and G band Bg are shown.

D band Bd is a band that emits light due to a crystal defect of graphene. G band Bg is a band that emits light due to a six-membered ring of graphene.

Therefore, the presence of defects in the graphene (polycrystalline) can be confirmed based on the peak of D band Bd of the Raman spectrum. It is understood that more crystal defects are present in the graphene as the peak of D band Bd is higher. Also, it is understood that almost no crystal defects are present in the graphene as the peak of D band Bd is lower.

Further, the presence or absence of graphene can be confirmed based on G band Bg of the Raman spectrum. It is understood that more amount of graphene is formed as the peak of G band Bg is higher. Also, it is understood that less graphenes are formed as the peak of G band Bg is lower.

Therefore, the ratio of the peak height of G band Bg to the peak height of D band Bd, that is, the G/D ratio is used as an index indicating the quality of graphene. The G/D ratio is the ratio (G/D) of the peak height of the G band to the peak height of the D band in the spectrum obtained by visible Raman analysis by use of incident light with the wavelength of 532 nm. It is said that graphenes having less defects are formed as the G/D ratio becomes higher.

A sample used in the XRD method of FIG. 7B has a structure obtained by depositing TiN as a co-catalyst layer 40 to approximately 10 nm to 15 nm, depositing Co as a catalyst layer 50 to approximately 30 nm thereon and forming a graphene layer 60 on the catalyst layer 50 by use of the CVD method.

The (111) plane of the face-centered cubic structure or the (002) plane of the hexagonal close-packed structure of the catalyst layer 50 of the above sample is analyzed by use of the XRD method.

The peak of the (111) plane of the face-centered cubic structure or the (002) plane of the hexagonal close-packed structure becomes presents largely, when the (111) plane of the face-centered cubic structure or the (002) plane of the hexagonal close-packed structure is parallel to the surface of the semiconductor substrate and the ratio of the (111) plane of the face-centered cubic structure or the (002) plane of the hexagonal close-packed structure occupied in the plane of the semiconductor substrate 10 is high.

As shown in FIG. 7σ, the G/D ratio tends to become higher as the peak of the (111) plane of the face-centered cubic structure or the (002) plane of the hexagonal close-packed structure becomes higher. That is, as the peak of the (111) plane of the face-centered cubic structure or the (002) plane of the hexagonal close-packed structure of the catalyst layer 50 by XRD analysis becomes higher, the graphene layer grown on the catalyst layer 50 has higher quality and less defects. In other words, the graphene layer 60 of high quality can be obtained by setting the (111) plane of the face-centered cubic structure or the (002) plane of the hexagonal close-packed structure of the catalyst layer 50 parallel to the surface of the semiconductor substrate 10.

For example, the peak height of the (111) plane of the face-centered cubic structure or the (002) plane of the hexagonal close-packed structure of the catalyst layer 50 in sample Rb shown in FIG. 7A and FIG. 7B is 100 cps (count par second) or less and the G/D ratio thereof is approximately 1.2. On the other hand, the peak height of the (111) plane of the face-centered cubic structure or the (002) plane of the hexagonal close-packed structure of the catalyst layer 50 in sample Ra is 1000 cps or more and the G/D ratio thereof is approximately 2.3. Thereby, it is understood that the G/D ratio of the graphene layer 60 becomes higher as the peak of the (111) plane of the face-centered cubic structure or the (002) plane of the hexagonal close-packed structure of the catalyst layer 50 becomes higher.

It is desired that the peak height of the (111) plane of the face-centered cubic structure or the (002) plane of the hexagonal close-packed structure of the catalyst layer 50 is sufficiently larger than the height of the peak of the other plane (for example, the peak of XRD measurement due to the (111) plane of the face-centered cubic structure) (for example, ten times or larger).

According to the present embodiment, the co-catalyst layer 40 has the (111) plane of the face-centered cubic structure or the (002) plane of the hexagonal close-packed structure, and the (111) plane or (002) plane is parallel to the surface of the semiconductor substrate. Thereby, when the catalyst layer 50 has the face-centered cubic structure, the (111) plane thereof is oriented parallel to the surface of the semiconductor substrate and when it has the hexagonal close-packed structure, the (002) plane thereof is oriented parallel to the surface of the semiconductor substrate.

Further, by the same token, the upper surface of the catalyst layer 50 on which the graphene layer 60 is deposited becomes the (111) plane of the face-centered cubic structure or the (002) plane of the hexagonal close packed structure. Thereby, the graphene layer 60 having less crystal defects and low resistivity can be easily grown on the catalyst layer 50.

Therefore, even if the elements are further miniaturized, the electron scattering in the defective portion can be suppressed by utilizing the structure of co-catalyst/catalyst/graphene of the present embodiment, and thus, a semiconductor device including the high-quality graphene layer having lower resistivity in comparison with the conventional case can be realized.

Second Embodiment

In the first embodiment, when the co-catalyst layer 40 has the face-centered cubic structure, the co-catalyst layer 40 is oriented such that the (111) plane thereof is parallel to the surface of the semiconductor substrate 10, and when the co-catalyst layer 40 has the hexagonal close-packed structure, the co-catalyst layer 40 is oriented such that the (002) plane thereof is parallel to the surface of the semiconductor substrate 10.

However, the co-catalyst layer 40 may be formed of metal that has neither the face-centered cubic structure nor the hexagonal close-packed structure.

For example, the co-catalyst layer 40 may be a single-layered film formed of one or more materials selected from a first group consisting of V, Cr, Mn, Nb, Mo, Ta, and W having a body-centered cubic structure, a single-layered film formed of nitride of one or more materials selected from the first group, a single-layered film formed of alloy comprising at least two materials selected from the first group, or a laminated film including at least two material selected from a second group consist of V, Cr, Mn, Nb, Mo, Ta, W, every nitride comprising one or more materials selected from the first group, and every alloy comprising at least two of the materials selected from the first group. It is note that WN has the face-centered cubic structure or hexagonal close-packed structure, it belongs to the co-catalyst layer 40 in the first embodiment.

In this case, it is preferable that the co-catalyst layer 40 is formed with an amorphous form, that is, an amorphous structure or a microcrystalline structure. The entire portion of the co-catalyst layer 40 is not necessarily formed with the amorphous structure or the microcrystalline structure. It is sufficient if at least a portion of the co-catalyst layer 40 that contacts the catalyst layer 50 is formed with the amorphous structure or the microcrystalline structure.

Generally, it is known that metal tends to take preferential orientation in which it becomes the most stable state when metal is deposited on the underlying layer of the amorphous structure or the microcrystalline structure. In the present embodiment, a co-catalyst layer having the amorphous structure or microcrystalline structure is formed and the catalyst layer is oriented to the (111) plane of the face-centered cubic structure or the (002) plane of the hexagonal close-packed structure by utilizing the above characteristic. Therefore, even if the catalyst layer 50 is deposited on the co-catalyst layer 40 formed of metal having the amorphous structure or the microcrystalline structure, the (111) plane of the face-centered cubic structure or the (002) plane of the hexagonal close-packed structure of the catalyst layer 50 can be oriented parallel to the surface of the semiconductor substrate by forming the catalyst layer 50 to have the face-centered cubic structure or hexagonal close-packed structure.

Thereby, like the first embodiment, a high-quality graphene layer 60 having a high G/D ratio and less crystal defects can be formed on the catalyst layer 50. The other configuration of the second embodiment may be the same as that of the first embodiment. Further, the other manufacturing method of the second embodiment may be the same as that of the first embodiment. Therefore, in the second embodiment, substantially the same effect as that of the first embodiment can be attained.

FIGS. 8A to 8E are cross-sectional views showing examples of the structure of the co-catalyst layer 40 in the first or second embodiment.

Figure 8:
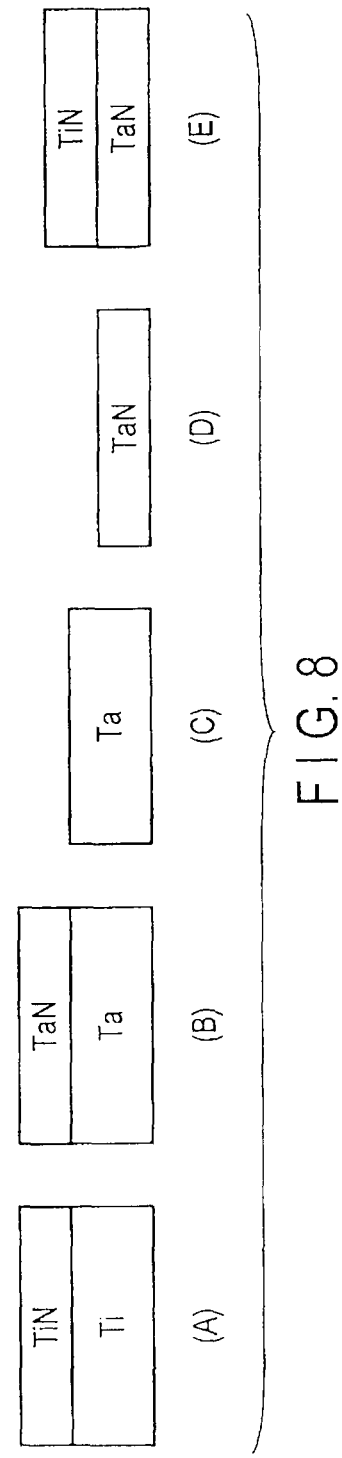
FIG. 8 is a cross-sectional view showing examples of the structure of a co-catalyst layer in the first or second embodiment.

FIG. 8A shows a laminated film of a Ti film and TiN film. The Ti film is formed to have the hexagonal close-packed structure and the TiN film is formed to have the face-centered cubic structure.

FIG. 8B shows a laminated film of a Ta film and TaN (tantalum nitride) film. When the Ta film is formed by use of a bias sputtering method that is the PVD method or a CVD method, a small amount of impurity is mixed into the Ta film. When the CVD method is used, for example, the small amount of impurity contains carbon in an organic source. As a result, a Ta film with the amorphous structure or microcrystalline structure may be formed.

A TaN film having the face-centered cubic structure or a TaN film having the amorphous structure or microcrystalline structure may be formed on the Ta film. The latter TaN film is further explained.

For example, TaxNy becomes Ta, Ta$_2$N or TaN depending on the tantalum composition (x) and nitrogen composition (y). When a TaN film is formed on the Ta film, the TaN film can be formed as a mixed layer including at least one of Ta, Ta$_2$N and TaN. Therefore, a TaN film having the amorphous structure or microcrystalline structure in at least the upper surface portion thereof may be formed on the TaN film. A co-catalyst layer with the above structure may also be used. A catalyst layer on the co-catalyst layer tends to take preferential orientation with respect to the crystal plane (the (111) plane of the face-centered cubic structure or the (002) plane of the hexagonal close-packed structure) with the crystal structure on which a graphene layer can be easily formed. A high-quality graphene layer is formed on the catalyst layer.

FIG. 8C shows a single-layered film of Ta. The Ta film is formed to have the amorphous structure. FIG. 8D shows a single-layered film of TaN. The TaN film is formed to have the face-centered cubic structure. FIG. 8E shows a laminated film of a TaN film and TiN film. The TaN film and TiN film are formed to have the face-centered cubic structure.

When the catalyst layer 50 is formed on the co-catalyst layer 40 formed of the above materials, the (111) plane of the face-centered cubic structure thereof is oriented parallel to the surface of the semiconductor substrate 10 or the (002) plane of the hexagonal close-packed structure thereof is oriented parallel to the surface of the semiconductor substrate 10. Thereby, a graphene layer 60 may be easily formed on the catalyst layer 50.

Therefore, even if the elements are further miniaturized, the electron scattering in the defective portion can be suppressed by utilizing the structure of co-catalyst/catalyst/graphene of the present embodiment and, thereby, a semiconductor device including the high-quality graphene layer having lower resistivity in comparison with the conventional case can be realized.

The following merits can be obtained by using the structure in which the co-catalyst layer and catalyst layer are oriented as described in the first and second embodiments.

The first merit is that the structure reduces the defects of the graphene, resulting in enlarging the domain of the grapheme.

The second merit is that the structure assists the control of growth origin of the graphene. Particularly, if the growth is performed at a temperature such as 600° C., it is considered that graphene grows not from the surface of the catalyst layer but from the edge of the facet of the catalyst layer. As an angle of the facet edge face, an (100), (100) plane of face-centered cubic structure can be relatively stably formed with respect to the catalyst surface oriented to (111) plane of face-centered cubic structure, for example. Thus, the facet planes can be uniformly arranged by controlling the orientation of the catalyst layer. Basically, the graphene layer can easily be formed with only a concave-convex portion, and the angles can be relatively uniformed when the orientation of the catalyst layer and the orientation of the co-catalyst layer are coincident. For example, the characteristic angles are approximately 34.5 degrees [angle made between the (111) plane and the (110) plane] and 54.7 degrees [angle made between the (111) plane and the (100) plane] with respect to the respective surfaces. It is important to control the orientation of the catalyst layer on the co-catalyst layer (underlying layer) also from the above viewpoint.

In the first and second embodiments, after the catalyst layer and graphene layer are formed on the co-catalyst layer, the layers are processed, but a graphene layer may be formed after the catalyst layer on the co-catalyst layer is processed. Further, the interconnection may be formed by a method as follows. An interconnection having damascene structure is formed, next the co-catalyst layer, the catalyst the layer, the graphene layer are formed, further, an insulating film or a metal film as a protection film for the graphene layer is formed, thereafter the extra film other than the interconnection is removed.

Third Embodiment

In the first and second embodiments, the semiconductor device including the interconnection formed by use of the RIE method (RIE interconnection) is explained, but in the present embodiment, a semiconductor device including an interconnection formed by use of a damascene method (damascene interconnection) is explained.

First, the structure shown in FIG. 4 is formed as in the first embodiment.

Next, as shown in FIG. 10, a stopper film 85 functioning as a stopper at the time of formation of grooves and an interlayer insulating film 90 are formed on a region including an interlayer insulating film 20 and contact plugs 30. For example, the stopper film 85 is a SiN film or a SiCN film. In the present embodiment, the stopper film 85 is the SiN film. The stopper film 85 may be omitted. The interlayer insulating film 90 may be a single-layered insulating film (for example, silicon nitride film or silicon oxide film) or may be a laminated insulating film (for example, a laminated film of a silicon nitride film and a silicon oxide film).

Next, as shown in FIG. 11, the interlayer insulating film 90 is selectively etched by use of the photolithography technique and RIE method. Next, the stopper film 85 is etched to expose the surface of the contact plugs 30. In this manner, interconnection grooves are formed.

Next, as shown in FIG. 12, a co-catalyst layer 40 is formed to cover the upper surface of the interlayer insulating film 90 and the side surfaces and bottom surfaces of the interconnection grooves. In the present embodiment, as the co-catalyst layer 40, a laminated film of a TiN film (upper layer) and Ti film (lower layer) is used. In this case, as shown in FIG. 12, the co-catalyst layer 40 is formed with the preferable step coverage. The shape of the sidewall of the interconnection groove and the angle of the sidewall of the interconnection groove are not specifically limited. For example, the angle of the sidewall of the interconnection groove is set in ranges of 90° or more and 20° or less. When the angle is small, the step difference of the groove can be attained by forming the interconnection groove shallow. Thereby, even if the angle is small, a short circuit between adjacent interconnections can be prevented from occurring.

Figure 13:
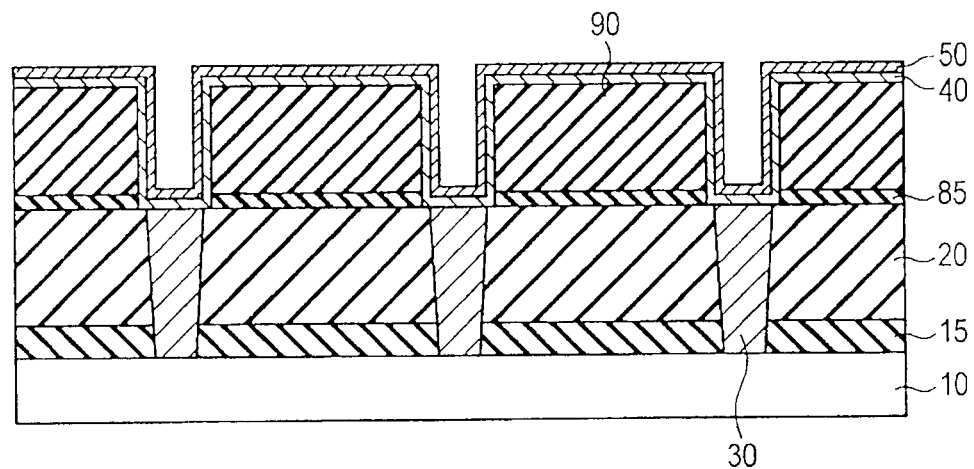
FIG. 13 is a cross-sectional view showing the manufacturing method of the semiconductor device following FIG. 12.

Next, as shown in FIG. 13, a catalyst layer 50 is formed on the co-catalyst layer 40. The co-catalyst layer 40 may be exposed to air between a step of forming the co-catalyst layer 40 and a step of forming the catalyst layer 50. However, it is preferable to hold the co-catalyst layer 40 in a vacuum atmosphere from the viewpoint of formation of a high-quality catalyst layer 50.

Figure 14:
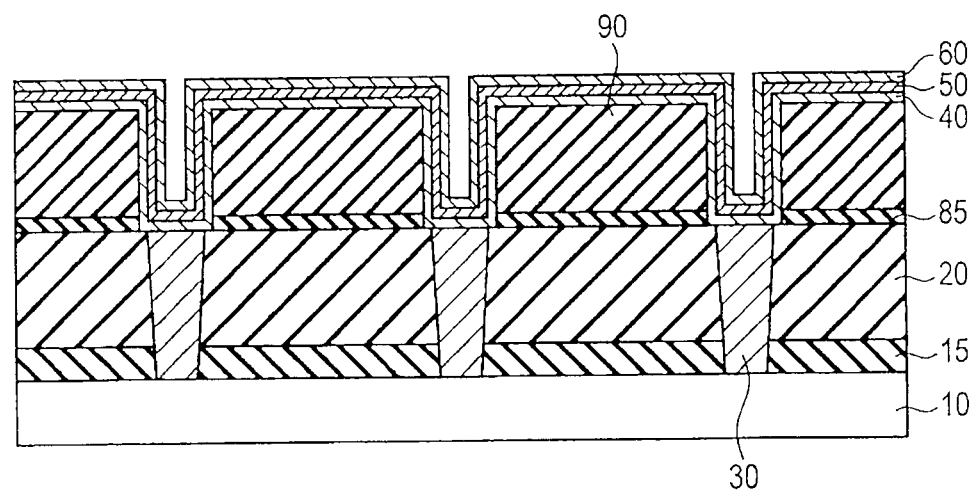
FIG. 14 is a cross-sectional view showing the manufacturing method of the semiconductor device following FIG. 13.

Next, as shown in FIG. 14, the catalyst layer 50 is subjected to preprocess, and then a graphene layer 60 is formed on the catalyst layer 50. The preprocess is, for example, a process using remote plasma with mixture gas including gases such as Ar, $H_2$, $N_2$, and the process is performed at temperature between 200 degrees and 100 degrees, for example, the process is performed at 350 degrees.

Like the first embodiment, for example, a method for forming the graphene layer 60 is CVD method. When the CVD method is used, hydrocarbon-series gas such as methane or acetylene or mixed gas thereof is used as a carbon source, and rare gas or hydrogen is used as carrier gas. The upper limit of formation temperatures of the graphene layer 60 is approximately 1000° C. and the lower limit is approximately 200° C. and, as described before, the formation temperature is approximately 600° C., for example. In addition, in order to eliminate ions and electrons by use of remote plasma, for example, an electrode may be placed on the upper portion of the semiconductor substrate 10 and a voltage may be applied to the electrode. As described before, the voltage applied to the electrode is 0 to ±100 V, for example.

Next, as shown in FIG. 15, a protection film 110 is formed on the graphene layer 60 to fill the interconnection grooves.

For example, the protection film 110 is an insulating film. In this case, for example, the protection film 110 is formed by CVD method or coating method. The protection film 110 may be a metal film. In this case, the protection film 110 is formed by sputtering method, for example.

Next, as shown in FIG. 16, the co-catalyst layer 40, catalyst layer 50, graphene layer 60 and protection layer 110 outside the interconnection grooves are removed by CMP method to obtain damascene interconnections (interconnections including the co-catalyst layer 40, catalyst layer 50 and graphene layer 60).

After this, a known process follows. For example, as shown in FIG. 17, a step of forming a first interlayer insulating film 120, a step of forming a second interlayer insulating film 130 and a step of forming interconnections (for example, Cu interconnections or W interconnections) 140 connected to the damascene interconnections.

In the present embodiment, like the first embodiment, the co-catalyst layer 40 on the bottom of the interconnection groove has a face-centered cubic structure or hexagonal close-packed structure or an amorphous structure or microcrystalline structure. If the co-catalyst layer 40 has the face-centered cubic structure or hexagonal close-packed structure, the co-catalyst layer 40 is formed to orient the (111) plane of the face-centered cubic structure or the (002) plane of the hexagonal close-packed structure parallel to the surface of the semiconductor substrate 10.

Further, like the first embodiment, in the present embodiment, the catalyst layer 50 on the co-catalyst layer 40 has the face-centered cubic structure or hexagonal close-packed structure or the amorphous structure or microcrystalline structure. If the catalyst layer 50 has the face-centered cubic structure or hexagonal close-packed structure, the catalyst layer 50 is formed to orient the (111) plane of the face-centered cubic structure or the (002) plane of the hexagonal close-packed structure parallel to the surface of the semiconductor substrate 10.

A high-quality graphene layer 60 having lower resistivity can be formed on the bottom of the interconnection groove by forming the co-catalyst layer 40 on the bottom of the interconnection groove and forming the catalyst layer 50 on the co-catalyst layer 40. Thereby, even if the elements are further miniaturized, the damascene interconnection with low resistance can be realized.

Another damascene interconnection using the co-catalyst layer 40 and catalyst layer 50 of the present embodiment is explained.

Figure 19:
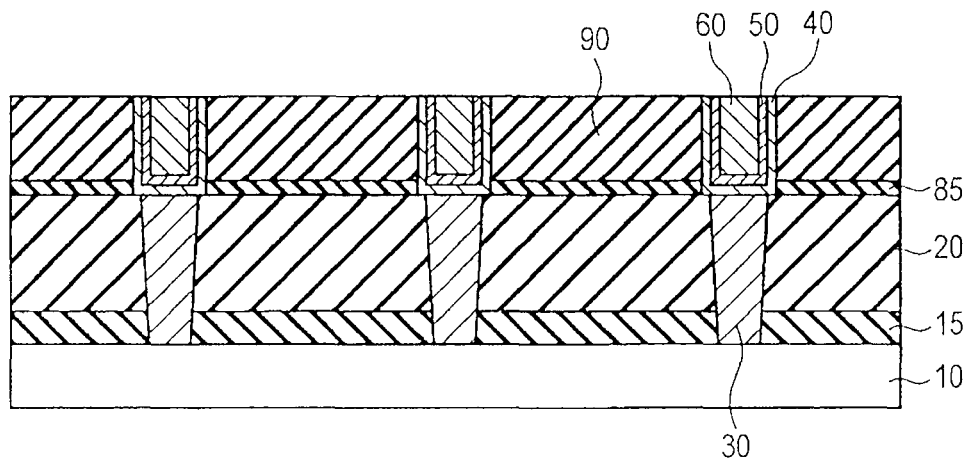
FIG. 19 is a cross-sectional view showing the damascene interconnection forming method following FIG. 18.

FIG. 18 and FIG. 19 show processes for forming another damascene interconnection without using a protection film. In this example, after the step of FIG. 13, a graphene layer 60 is formed to fill the interconnection grooves (FIG. 18). Then, the co-catalyst layer 40, catalyst layer 50 and graphene layer 60 outside the interconnection grooves are removed by CMP method to obtain damascene interconnections (FIG. 19).

Figure 20:
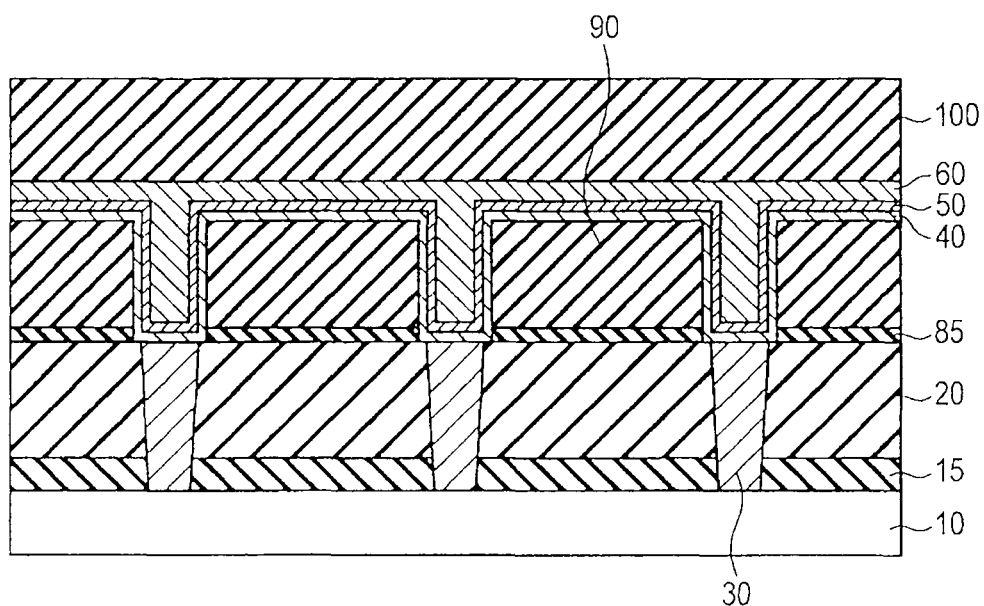
FIG. 20 is a cross-sectional view showing a damascene interconnection forming method using a co-catalyst layer and catalyst layer of the embodiment.
Figure 21:
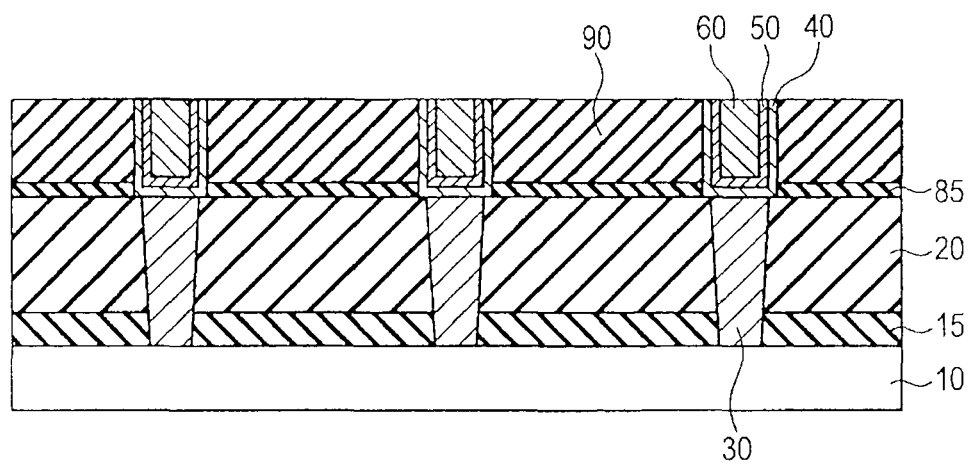
FIG. 21 is a cross-sectional view showing the damascene interconnection forming method following FIG. 18.

FIG. 20 and FIG. 21 show processes for forming another damascene interconnection by using the protection film. In this example, after the step of FIG. 13, a graphene layer 60 is formed to fill the interconnection grooves and a protection film 110 is formed on the graphene layer 60 (FIG. 20). Then, the co-catalyst layer 40, catalyst layer 50, graphene layer 60 and protection film 110 outside the interconnection grooves are removed by CMP method to obtain damascene interconnections (FIG. 21). A chemical process, RIE method or downflow etching method may be used instead of the CMP method or the above methods can be adequately combined.

The damascene interconnections of the present embodiment are connected to contact plugs 30 of lower layers, but the damascene interconnections of the present embodiment may be connected to interconnections (damascene interconnections or RIE interconnections) of lower layers. Further, the present embodiment can be applied to an interconnection (dual damascene interconnection) formed by dual damascene method.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a semiconductor substrate; and
   an interconnection provided above the semiconductor substrate, the interconnection including a co-catalyst layer, a catalyst layer provided on the co-catalyst layer, and a graphene layer provided on the catalyst layer,
   the co-catalyst layer comprising a portion contacting the catalyst layer, the portion having a face-centered cubic structure with a (111) plane oriented parallel to a surface of the semiconductor substrate, or having a hexagonal close-packed structure with a (002) plane oriented parallel to the surface of the semiconductor substrate, or the co-catalyst layer comprising a portion contacting the catalyst layer, the portion having an amorphous structure or a microcrystalline structure, and
   the catalyst layer having a face-centered cubic structure with a (111) plane oriented parallel to the surface of the semiconductor substrate, or having a Hexagonal close-packed structure with a (002) plane oriented parallel to the surface of the semiconductor substrate.

2. The semiconductor device according to claim 1, wherein the portion of the co-catalyst layer contacting the catalyst layer has the face-centered cubic structure or the hexagonal close-packed structure, and the co-catalyst layer is a single-layered film formed of one or more materials selected from a first group consisting of Ti, Cu, Zn, Zr, Ru, Rh, Pd, Ag, Hf, Re, Ir, Pt and Au, a single-layered film formed of nitride of one or more materials selected from the first group, a single-layered film formed of alloy comprising at least two materials selected from the first group, or a laminated film including at least two materials selected from a second group consist of Ti, Cu, Zn, Zr, Ru, Rh, Pd, Ag, Hf, Re, Ir, Pt, Au, every nitride comprising one or more materials selected from the first group, and every alloy comprising at least two of the materials selected from the first group.

3. The semiconductor device according to claim 1, wherein the portion of the co-catalyst layer contacting the catalyst layer has the amorphous structure or the microcrystalline structure, and
   the co-catalyst layer is a single-layered film formed of one or more materials selected from a first group consisting of V, Cr, Mn, Nb, Mo, Ta, and W, a single-layered film formed of nitride of one or more materials selected from the first group, a single-layered film formed of alloy comprising at least two materials selected from the first group, or a laminated film including at least two material selected from a second group consist of V, Cr, Mn, Nb, Mo, Ta, W, every nitride comprising one or more materials selected from the first group, and every alloy comprising at least two of the materials selected from the first group.

4. The semiconductor device according to claim 1, wherein the catalyst layer is a single-layered film formed of one or more materials selected from a first group consisting of Ni, Co and Fe, a single-layered film formed of nitride of one or more materials selected from the first group, a single-layered film formed of alloy comprising at least two materials selected from the first group, or a laminated film including at least two material selected from a second group consist of Ni, Co and Fe, every nitride comprising one or more materials selected from the first group, and every alloy comprising at least two of the materials selected from the first group.

* * * * *